United States Patent
Hisamune

[11] Patent Number: 5,929,480
[45] Date of Patent: Jul. 27, 1999

[54] NONVOLATILE SEMICONDUCTOR MEMORY DEVICE HAVING FIRST AND SECOND FLOATING GATES

[75] Inventor: Yosiaki Hisamune, Tokyo, Japan

[73] Assignee: NEC Corporation, Tokyo, Japan

[21] Appl. No.: 08/767,845

[22] Filed: Dec. 17, 1996

[30] Foreign Application Priority Data

Dec. 18, 1995 [JP] Japan .................................. 7-328642

[51] Int. Cl.$^6$ .............................................. H01L 29/788
[52] U.S. Cl. ...................... 257/320; 257/315; 257/316; 257/319; 365/185.28
[58] Field of Search ................................... 257/314, 315, 257/316, 319, 320; 365/185.28

[56] References Cited

U.S. PATENT DOCUMENTS 5,596,529  1/1997  Noda et al. ........................ 365/185.28

FOREIGN PATENT DOCUMENTS 56-32464   3/1981   Japan .
62-94987   5/1987   Japan .
1-212472   8/1989   Japan .

OTHER PUBLICATIONS

"A Source Side Injection Erasable Programmable Read–Only–Memory (SI–EPROM) Device," by A.T. Wu et al., *IEEE Electron Device Letters*, EDL–7, No. 9, Sep. 1986, pp. 540–542.

Primary Examiner—Valencia Martin-Wallace
Attorney, Agent, or Firm—Sughrue, Mion, Zinn Macpeak & Seas, PLLC

[57] ABSTRACT

A nonvolatile semiconductor memory is composed of a number of multi-bit memory cells, each including a first floating gate and a second floating gate formed, side by side, and insulated from each other, on a first gate insulator film formed on a channel region defined between a source region and a drain region, a second gate insulator film formed to cover a surface of each of the floating gates, and a control gate formed on the second gate insulator film. The first floating gate is positioned above a source side of the channel region, and the second floating gate is postioned above a drain side of the channel region. At least the first floating gate is formed of a side wall polysilicon having a gate length remarkably smaller than that of the second floating gate or the control gate. Accordingly, the resulting channel length of the memory cell is remarkably reduced, with the result that the occupying area of each memory cell and the occupying area of a necessary peripheral circuit can be reduced.

5 Claims, 12 Drawing Sheets

NONVOLATILE SEMICONDUCTOR MEMORY DEVICE HAVING FIRST AND SECOND FLOATING GATES

BACKGROUND OF THE INVENTION

1. Field of the Invention

The present invention relates to a semiconductor integrated circuit, and more specifically to a nonvolatile semiconductor memory, a method for manufacturing the same, and a method of using the same.

2. Description of Related Art

A nonvolatile semiconductor memory represented by for example, by a flash EEPROM (electrically erasable programmable read only memory), has a capability of electrically writing, erasing and reading memory cells provided therein. A typical memory cell is composed of a single electric field effect transistor including a floating gate, a second gate insulator film and a control gate which are formed in the named order on a channel region defined between a source and a drain formed in a surface of a semiconductor substrate, the control gate being capacitively coupled with the floating gate through the second gate insulator film. The memory cell of this structure can store data by allocating "0" and "1" to different thresholds attributable to different charge storage conditions of the floating gate.

With a recently widened utilization of the nonvolatile semiconductor memory, a demand for a nonvolatile semiconductor memory having a high integration density is increasing, in order to miniaturize a system or apparatus incorporating therein the nonvolatile semiconductor memory, and in order to lower the cost per bit of stored information. For the purpose of meeting this demand, there has been proposed a new nonvolatile semiconductor memory having a plurality of floating gates, different from the conventional nonvolatile semiconductor memory as mentioned above.

For example, Japanese Patent Application Laid-open Publication No. JP-A-62-094987 proposes an electric field effect transistor (memory cell) as shown in FIG. 1 (called a "first prior art example" hereinafter). Namely, the shown electric field effect transistor includes a P-type semiconductor substrate 10 having a drain 11 and a source 12 formed on a principal surface thereof to define a channel 10A therebetween, and a first floating gate 16 and a second floating gate 15 which are formed, separately from each other in a direction parallel to the principal surface of the substrate, on a first gate insulator 13 formed on the channel 10A. Furthermore, a second gate insulator film 14 is formed to cover the first floating gate 16 and the second floating gate 15, and a control gate 17 is formed on the second gate insulator film 14, so that the control gate 17 capacitively coupled with each of the first floating gate 16 and the second floating gate 15 through the second gate insulator film 14.

With this arrangement, a reading current of four different levels can be obtained dependent upon whether or not an electric charge is stored in the first floating gate 16 and upon whether or not an electric charge is stored in the second floating gate 15. Thus, data of two bits can be stored by allocating the four different levels of the reading current to "00", "01", "10" and "11", respectively. In other words, it may be said that a multi-bit memory cell can be realized.

Furthermore, Japanese Patent Application Laid-open Publication No. JP-A-1-212472 proposes an electric field effect transistor (memory cell) as shown in FIG. 2 (called a "second prior art example" hereinafter). Namely, the shown electric field effect transistor includes two floating gates 6S and 6D, similar to the first prior art example mentioned above, and a control gate 8 formed to cover the two floating gates 6S and 6D in an insulating relation. Similarly to the first prior art example, a reading current of four different levels can be obtained dependent upon whether or not an electric charge is stored in the first floating gate 16 and upon whether or not an electric charge is stored in the second floating gate 15. Thus, data of two bits can be stored by allocating the four different levels of the reading current to "00", "01", "10" and "11", respectively. Namely, a multi-bit memory cell is realized.

The memory cell of this second prior art example can be written by applying a positive voltage to the control gate 8 and one of a source and a drain, and grounding the other of the source and the drain, so that channel hot electrons are generated and injected into the selected floating gate. On the other hand, data can be erased by irradiating an ultraviolet ray to the memory cell so that the electrons trapped in the floating gates are discharged.

The above mentioned prior art semiconductor memories have various problems. A first problem is that, if a method for manufacturing the nonvolatile semiconductor memories composed of memory cells having the two floating gates is estimated, a gate length of each memory cell cannot be made less than three times a limit length (design standard) of a photolithography.

The reason for this is as follows: Since it is desirable to simultaneously form the first floating gate and the second floating gate by patterning the same polysilicon layer by the same photolithographic step, a distance between the source and the drain is required to have a total length of a length of the first floating gate, a distance between the first floating gate and the second floating gate, and a length of the second floating gate.

A second problem is that a large current is required for a writing operation in the nonvolatile semiconductor memories composed of memory cells having the two floating gates, and therefore, it is difficult to realize a low voltage operation of the nonvolatile semiconductor memory.

The reason is that: The memory cell writing is carried out by applying a positive voltage to the control gate and one of the source and the drain and grounding the other of the source and the drain and the substrate, so that channel hot electrons are generated in a pinch-off region in proximity of the source or the drain applied with the positive voltage, and the generated channel hot electrons are injected into the floating gate. However, an injection coefficient defined by a ratio of a gate current to a channel current is as low as about $10^{-6}$, and therefore, a very large channel current is required. For example, in the case of a memory cell having the gate length of 1 $\mu$m, the channel current of several milliamperes is required in the writing operation, and therefore, a large peripheral circuit is required in the memory device.

SUMMARY OF THE INVENTION

Accordingly, it is an object of the present invention to provide a nonvolatile semiconductor memory which has overcome the above mentioned defects of the conventional one.

Another object of the present invention is to provide a nonvolatile semiconductor memory composed of multi-bit memory cells which have a reduced cell area and which can be written with a reduced consuming current, so that an area required for a peripheral circuit can be correspondingly reduced.

Still another object of the present invention is to provide a method for manufacturing the nonvolatile semiconductor memory as mentioned above, and a method of using the nonvolatile semiconductor memory as mentioned above.

The above and other objects of the present invention are achieved in accordance with the present invention by a nonvolatile semiconductor memory composed of a number of memory cells, each of which is constituted of a transistor comprising:

a semiconductor substrate having a principal surface of a first conductivity type;

a source region and a drain region formed in the principal surface of the semiconductor substrate, the source region and the drain region being of a second conductivity type opposite to the first conductivity type;

a channel region defined in the principal surface of the semiconductor substrate between the source region and the drain region;

a first gate insulator film formed on the channel region;

a first floating gate formed on the first gate insulator film above a source side portion of the channel region;

a second floating gate formed on the first gate insulator film above a drain side portion of the channel region, the second floating gate being electrically insulated from the first floating gate;

a second gate insulator film formed on a surface of each of the first floating gate and the second floating gate; and a control gate formed on the second gate insulator film with the second gate insulator film being sandwiched between the control gate and each of the first floating gate and the second floating gate;

the first floating gate and the second floating gate being arranged in series in a layout pattern between the source region and the drain region, a gate length of the first floating gate being shorter than a gate length of the second floating gate or a gate length of the control gate.

In one embodiment, the principal surface of the semiconductor substrate is of a P type.

In a preferred embodiment, the first floating gate is formed of a side wall polysilicon having the gate length shorter than a photolithographic patterning limit.

Specifically, the second floating gate has a gate length limited by a photolithographic patterning limit, and a third gate insulator film is formed on a source-side side wall of the second floating gate, and the first floating gate is constituted of a side wall polysilicon formed on the third gate insulator film formed on the source-side side wall of the second floating gate to have the gate length shorter than that of the second floating gate.

Alternatively, the control gate is formed on a gate insulator film formed on a center portion of the channel region and has a gate length limited by a photolithographic patterning limit, and the second gate insulator is formed on each of a pair of opposite side walls of the control gate, and the first floating gate is formed of a side wall polysilicon formed on the second gate insulator formed a source-side side wall of the opposite side walls of the control gate, and the second floating gate is formed of a side wall polysilicon formed on the second gate insulator formed a drain-side side wall of the opposite side walls of the control gate, so that the gate length of each of the first floating gate and the second floating gate is shorter than the gate length of the control gate.

According to another aspect of the present invention, there is provided a method for manufacturing the above mentioned nonvolatile semiconductor memory, wherein formation of the second floating gate is conducted by a first etching for patterning a gate member into an elongated gate member extending in a column direction perpendicular to a gate length direction of the memory cell, and a second etching for dividing the elongated gate member in the column direction to form the second floating gate for each memory cell, and formation of the first floating gate is conducted by forming a third gate insulator film on a source-side side wall of the elongated gate member and forming a side wall polysilicon on the third gate insulator film, after the first etching but before the second etching, and by dividing the side wall polysilicon in the column direction to form the first floating gate for each memory cell, by the second etching.

Alternatively, in the method for manufacturing the above mentioned nonvolatile semiconductor memory, formation of the control gate is conducted by a first etching for patterning a gate member into an elongated gate member extending in a column direction perpendicular to a gate length direction of the memory cell, and a second etching for dividing the elongated gate member in the column direction to form the control gate for each memory cell, and formation of the first floating gate and the second floating gate is conducted by forming the second gate insulator film on a pair of opposite side walls of the elongated gate member and forming a side wall polysilicon on the second gate insulator film, after the first etching but before the second etching, and by dividing the side wall polysilicon in the column direction by the second etching, so that the first floating gate is formed of the side wall polysilicon remaining on the second gate insulator formed a source-side side wall of the opposite side walls of the elongated gate member, and the second floating gate is formed of the side wall polysilicon remaining on the second gate insulator formed a drain-side side wall of the opposite side walls of the elongated gate member.

According to still another aspect of the present invention, there is provided a method for using the above mentioned nonvolatile semiconductor memory, wherein the memory cell is put in an erased condition by putting the control gate in a negative voltage condition compared with to the source region, the drain region, and the P-type semiconductor substrate principal surface, so as to cause electrons to be discharged from both of the first floating gate and the second floating gate, wherein the first floating gate is put in a written condition by applying a positive voltage to the control gate and the drain region and by grounding the source region and the P-type semiconductor substrate principal surface, so as to cause electrons to be injected into the first floating gate, and wherein the second floating gate is put in a written condition by applying a positive voltage to the control gate and the source region and by grounding the drain region and the P-type semiconductor substrate principal surface, so as to cause electrons to be injected into the second floating gate.

Alternatively, in the method for using the above mentioned nonvolatile semiconductor memory, the memory cell is put in an erased condition by putting the control gate in a positive voltage condition compared with the source region, the drain region, and the P-type semiconductor substrate principal surface, so as to cause electrons to be injected into both the first floating gate and the second floating gate.

The first floating gate is put in a written condition by applying a negative voltage to the control gate and a positive voltage to the source region and by grounding or floating the drain region and the P-type semiconductor substrate principal surface, so as to cause electrons to be discharged from the first floating gate.

Further, the second floating gate is put in a written condition by applying a negative voltage to the control gate and a positive voltage to the drain region and by grounding or floating the source region and the P-type semiconductor substrate principal surface, so as to cause electrons to be discharged from the second floating gate.

As seen from the above, the nonvolatile semiconductor memory in accordance with the present invention is characterized in that the first and second floating gates have different gate lengths or at least the first floating gate has a gate length shorter than that of the control gate.

This construction can be realized by forming at least the first floating gate of a side wall polysilicon, with the result that an occupying area of the memory cell can be greatly reduced. Specifically, assuming that the design standard (photolithographic patterning limit) is "f", the first and second prior art examples of memory cells as mentioned hereinbefore has gate lengths of "3f", while the gate length of the memory cell in accordance with the present invention can be made on the order of "1.2f".

Furthermore, the method in accordance with the present invention for manufacturing the nonvolatile semiconductor memory in accordance with the present invention is characterized in that the first floating gate is formed of a polysilicon film formed through the gate insulator film on the side wall of the second floating gate or the control gate after the second floating gate or the control gate is patterned in the column direction, and the first floating gate, and the control gate and the first and second floating gates are patterned together in the row direction.

The first method invention for using the nonvolatile semiconductor memory in accordance with the present invention is characterized in that the erased condition is obtained by discharging electrons from both of the first and second floating gates, a first written condition is realized by applying a positive voltage to the control gate and the drain and by grounding the source and the substrate principal surface, so as to cause electrons to be injected into the first floating gate, and a second written condition is realized by applying a positive voltage to the control gate and the source and by grounding the drain and the substrate principal surface, so as to cause electrons to be injected into the second floating gate. Here, the principle of this electron injection is called a "source-side injection", and is discussed in detail by A. T. Wu, T. Y. Chan, P. K. Ko and C. Hu, "A Source-Side Injection Erasable Programmable Read-Only Memory (SI-EPROM) Device", IEEE Electron Device Letters, EDL-7, No.9, pp540–542, the disclosure of which is incorporated by reference in its entirety into this application. Namely, in a memory cell having an offset between a floating gate to be injected with electrons and a source or a drain, the control gate is applied with a positive voltage (for example, +12 V), and one of the source and the drain remote from the floating gate to be injected with electrons is applied with a positive voltage (for example, +7 V), an electric field is concentrated or condensed in the offset region in a channel direction, so that hot electrons are generated and the generated hot electrons are injected into the floating gate to be injected with electrons. At this time, since a channel resistance is large in the offset region, a maximum electric field generated in this offset region is extremely large, so that a hot electron injection efficiency is high. As a result, the writing current is made smaller, by one or two digits or figures, than that of the prior art electron injection method made at the drain side (in proximity of the pinch off point), and therefore, the memory can operate with a low voltage and with a low electric power.

According to the second method in accordance with the present invention for using the nonvolatile semiconductor memory in accordance with the present invention is characterized in that the erased condition is obtained by injecting electrons to both of the first and second floating gates, a first written condition is realized by applying a negative voltage to the control gate and a positive voltage to the source and by grounding or floating the drain and the substrate principal surface, so as to cause electrons to be discharged from the first floating gate, and a second written condition is realized by applying a negative voltage to the control gate and a positive voltage to the drain and by grounding or floating the source and the substrate principal surface, so as to cause electrons to be discharged from the second floating gate. Here, the injection and the discharge of the electrons are realized by the Fowler-Nordheim tunnel current. This writing current (gate current) is smaller, by about five digits or figures, than that of the prior art drain-side channel hot electron injection writing current, and therefore, the memory can operate with a low voltage and with a low electric power. On the other hand, the erasing operation of the memory cell is conducted by the source-side channel hot electron injection or the Fowler-Nordheim tunnel current. The consumed current in this erasing operation is sufficiently smaller than the drain-side channel hot electron injection current. Therefore, a load of a step-up or boosting circuit can be reduced, and accordingly, the power supply voltage can be lowered.

The above and other objects, features and advantages of the present invention will be apparent from the following description of preferred embodiments of the invention with reference to the accompanying drawings.

DESCRIPTION OF THE PREFERRED EMBODIMENTS

Figure 1:
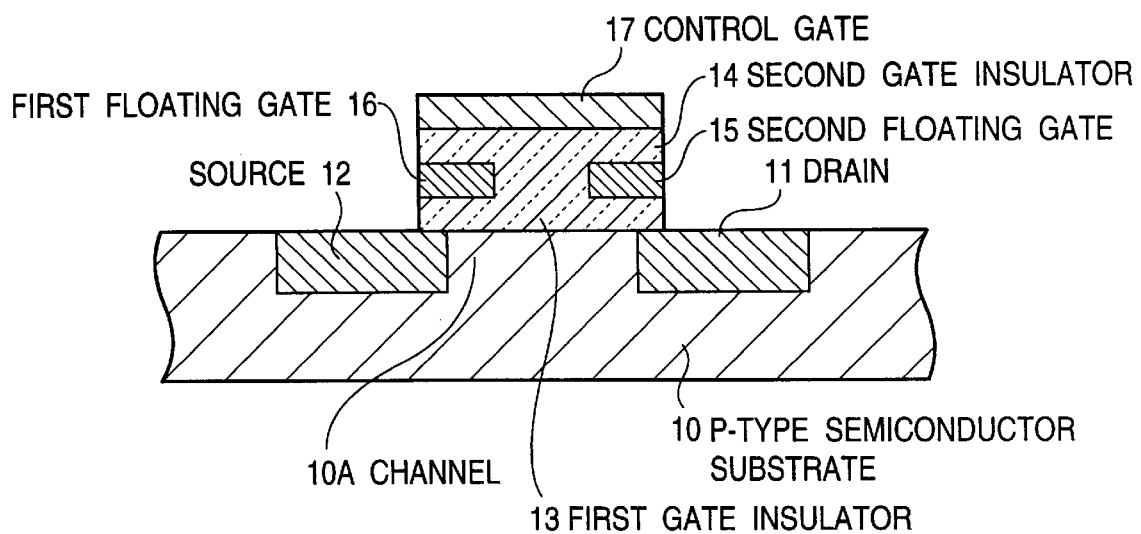
FIG. 1 is a diagrammatic sectional view of a first example of the prior art multi-bit memory cell of the electric field effect transistor type.
Figure 2:
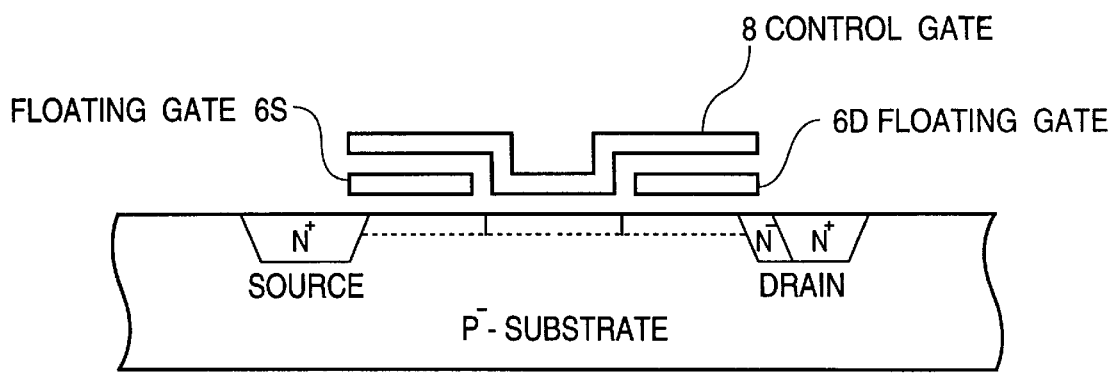
FIG. 2 is a diagramniatic sectional view of a second example of the prior art multi-bit memory cell of the electric field effect transistor type.
Figure 3A:
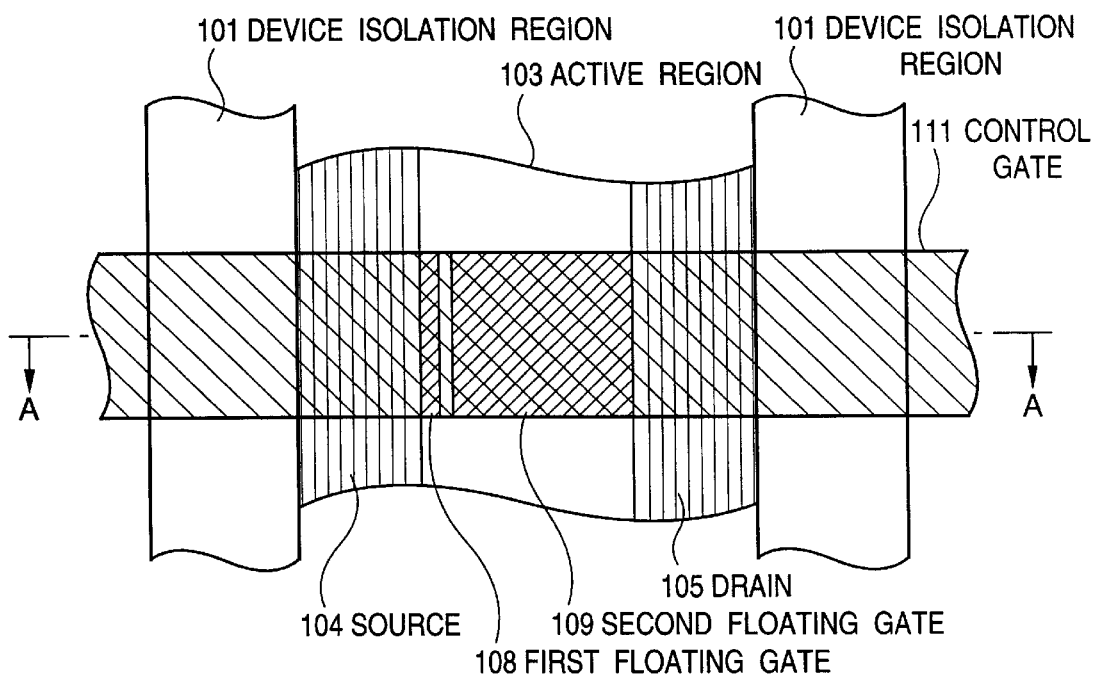
FIG. 3A is a diagrammatic partial plan view of a multi-bit memory cell of a first embodiment of the nonvolatile semiconductor memory in accordance with the present invention.
Figure 3B:
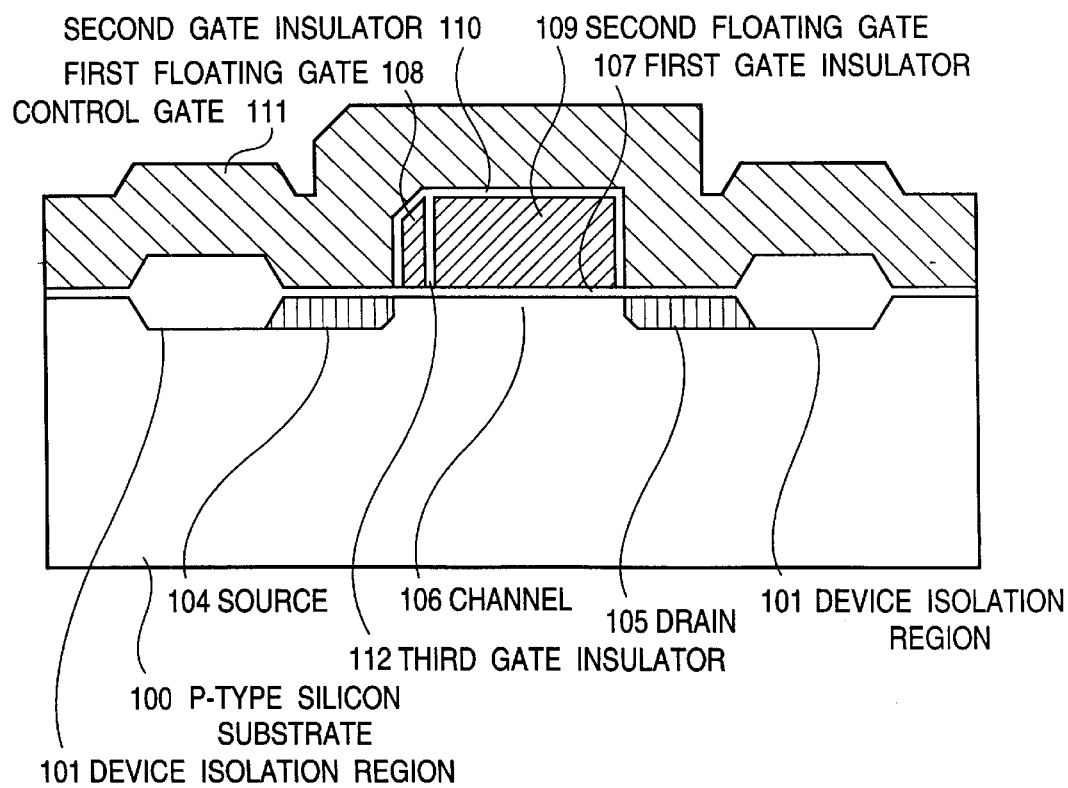
FIG. 3B is a diagrammatic sectional view taken along the line A—A in FIG. 3A.

Referring to FIG. 3A, there is shown a diagrammatic partial plan view of a multi-bit memory cell of a first embodiment of the nonvolatile semiconductor memory in accordance with the present invention. FIG. 3B is a diagrammatic sectional view taken along the line A—A in FIG. 3A.

The shown embodiment is a flash memory, and a unitary flash memory cell shown in FIGS. 3A and 3B is formed in an active region 103 formed on a P-type silicon substrate 100 and confined between device isolation regions 101 formed of a silicon oxide on a principal surface of the substrate 100. The shown unitary flash memory cell includes a source region 104 and a drain region 105 formed in the active region 103, separately from each other, to define a channel region 106 therebetween. A first gate insulator film 107 is formed on the channel region 106, and a first floating gate 108 and a second floating gate 109 are formed on the first gate insulator film 107, side by side, but separated from each other by a third gate insulator film 112. Therefore, the first floating gate 108 and the second floating gate 109 are electrically isolated from each other. Furthermore, a second gate insulator film 110 is formed to cover the first floating gate 108 and the second floating gate 109, and a control gate 111 is formed on the second gate insulator film 110, to overlie the first floating gate 108 and the second floating gate 109.

Figure 4:
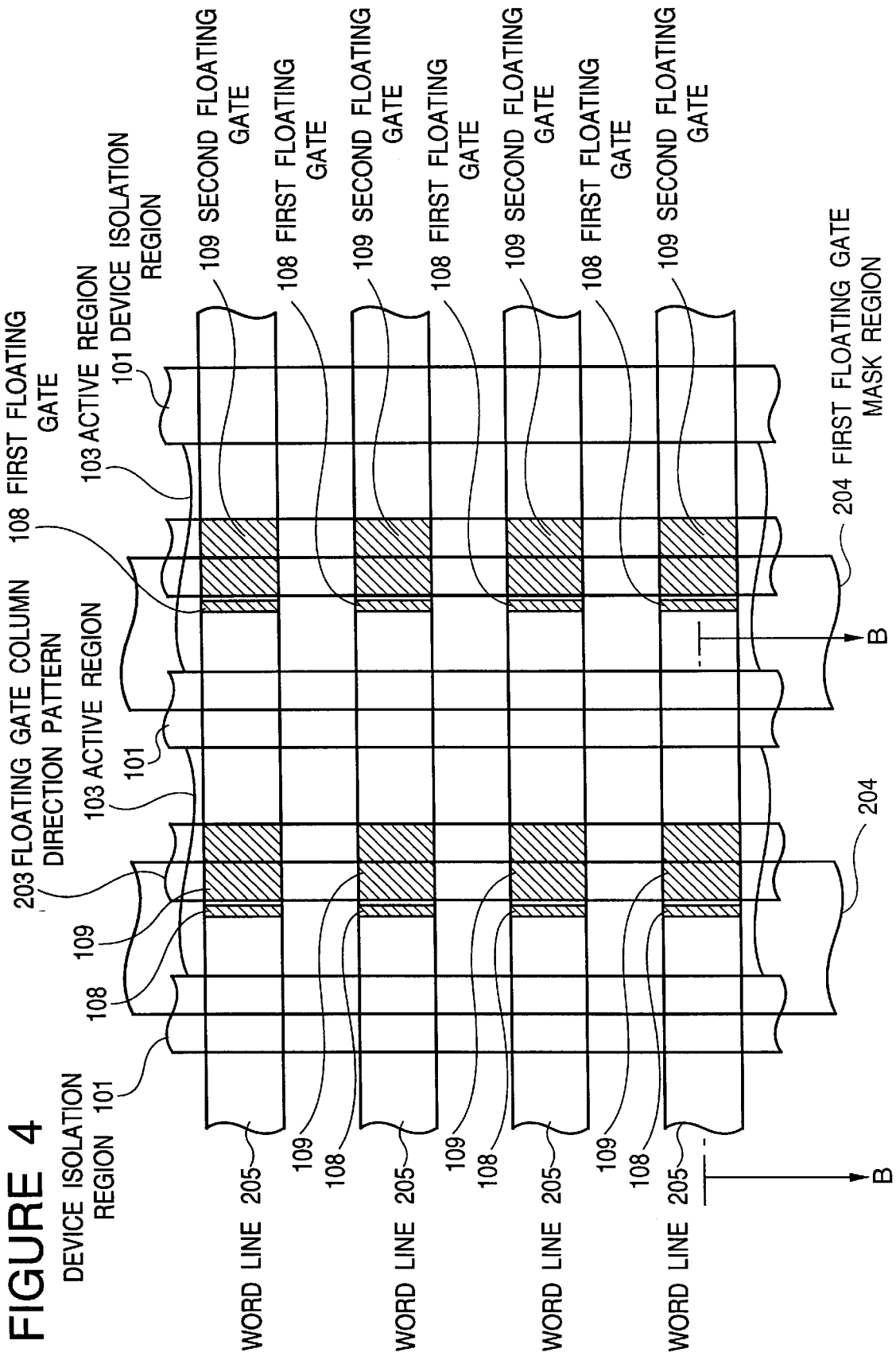
FIG. 4 is a mask layout pattern diagram of a memory cell array composed of memory cells shown in FIGS. 3A and 3B.

Now, referring to FIG. 4, there is shown a mask layout pattern diagram of a memory cell array composed of memory cells, which has a contactless structure in which each of a bit line and a source line is constituted of a buried diffused layer. In addition, FIG. 4 mainly depicts mask layout patterns used in a photolithographic process, but the floating gates are depicted by hatching to assist understanding.

In FIG. 4, Reference Numeral 101 designates a device isolation region, and Reference Numeral 103 indicates an active region which is a region other than the device isolation regions 101. Reference Numeral 203 shows a floating gate column direction pattern. Reference Numeral 204 is a first floating gate mask region, and Reference Numeral 205 denotes a word line which constitutes a mask pattern and which also functions as the control gate 111. Reference Numeral 108 designates a first floating gate, and Reference Numeral 109 indicates a second floating gate.

Ordinarily, a wiring conductor constituted of the buried diffused layer has a high wiring resistance, and therefore, it is possible to form an aluminum wiring conductor in parallel to tie buried diffused layer and to connect the aluminum wiring conductor to the buried diffused layer through a contact hole, at intervals of several bits to several ten bits, so that a total wiring resistance can be reduced.

FIGS. 5A to 5E are diagrammatic sectional views taken along the line B—B in FIG. 4, for illustrating a process for manufacturing the memory cell shown in FIGS. 3A and 3B.

Now, a process for manufacturing the flash memory cell shown in FIGS. 3A and 3B, will be described with reference to FIGS. 4 and 5A to 5E.

Figure 5A:
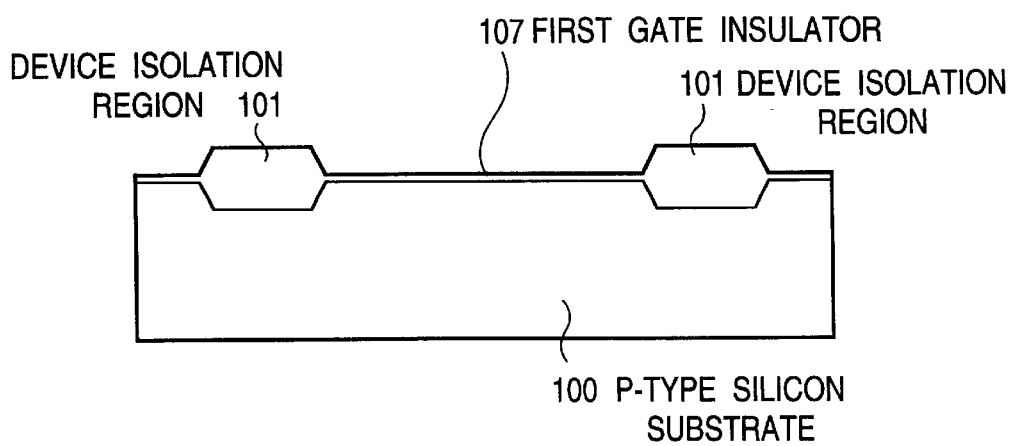
FIGS. 5A to 5B are diagrammatic sectional views taken along the line B—B in FIG. 4, for illustrating a process for manufacturing the memory cell shown in FIGS. 3A and 3B.

First, as shown in FIG. 5A, device isolation regions 101 are formed on a principal surface of a P-type silicon substrate 100 by a selectively oxidized isolation process, and then, a silicon oxide film having a thickness of about 10 nm is grown to form a first gate insulator film 107. For example, the device isolation regions 101 can be formed by using a photolithography using a mask corresponding to the active region 103.

Figure 5B:
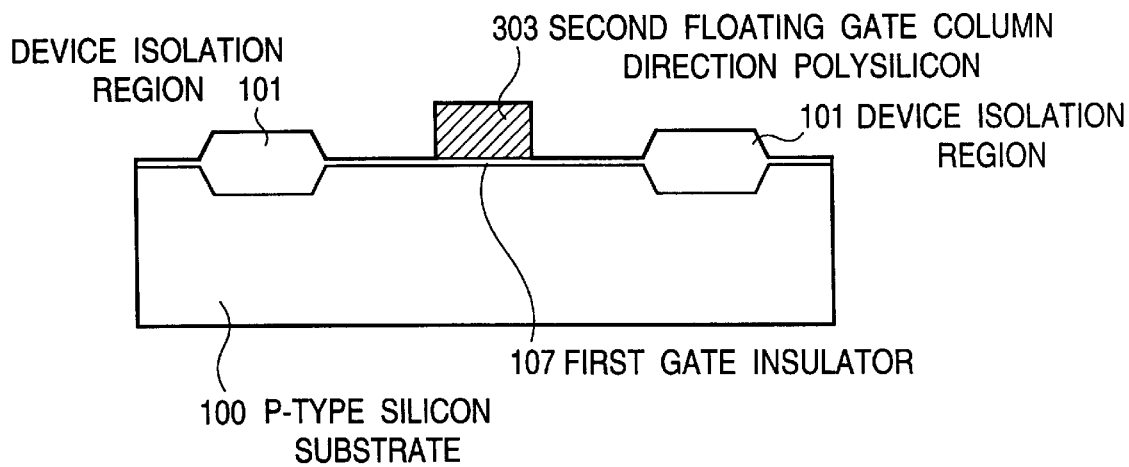

Thereafter, a first polysilicon having a thickness of about 250 nm is grown on the whole surface, and phosphorus is doped to the first polysilicon. Furthermore, as shown in FIG. 5B, the first polysilicon is patterned in a column direction to form a second floating gate column direction polysilicon 303 (first etching). This patterning can be realized by using a photolithography using a mask corresponding to a floating gate column direction pattern 203, and a dry etching.

Figure 5C:
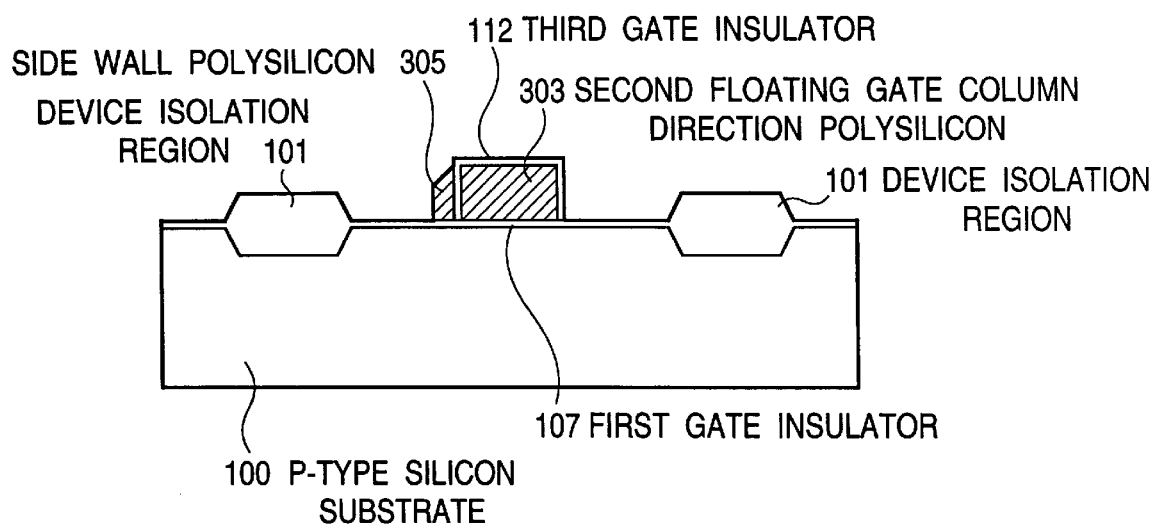

Succeedingly, a silicon oxide film having a thickness of about 15 nm to 25 nm is grown on the whole surface of the second floating gate column direction polysilicon 303, to form a third gate insulator film 112. Thereafter, a second polysilicon having a thickness of about 100 nm to 300 nm is grown on the whole surface, and phosphorus is doped to the first polysilicon. Furthermore, an anisotropic dry etching is conducted to the second polysilicon, so that a side wall polysilicon is formed on each of a pair of opposite side walls of the second floating gate column direction polysilicon 303. Thereafter, a first floating gate mask region 204 shown in FIG. 4 is covered with a photoresist, and the remaining polysilicon is isotropically etched, so that as shown in FIG. 5C, a side wall polysilicon 305 is constituted of the second polysilicon which remains on only one side wall of the second floating gate column direction polysilicon 303. A width (in a gate length direction) of the side wall polysilicon 305 becomes smaller than the film thickness of the second polysilicon, and is ordinarily on the order of 80% of the film thickness of the second polysilicon.

Figure 5D:
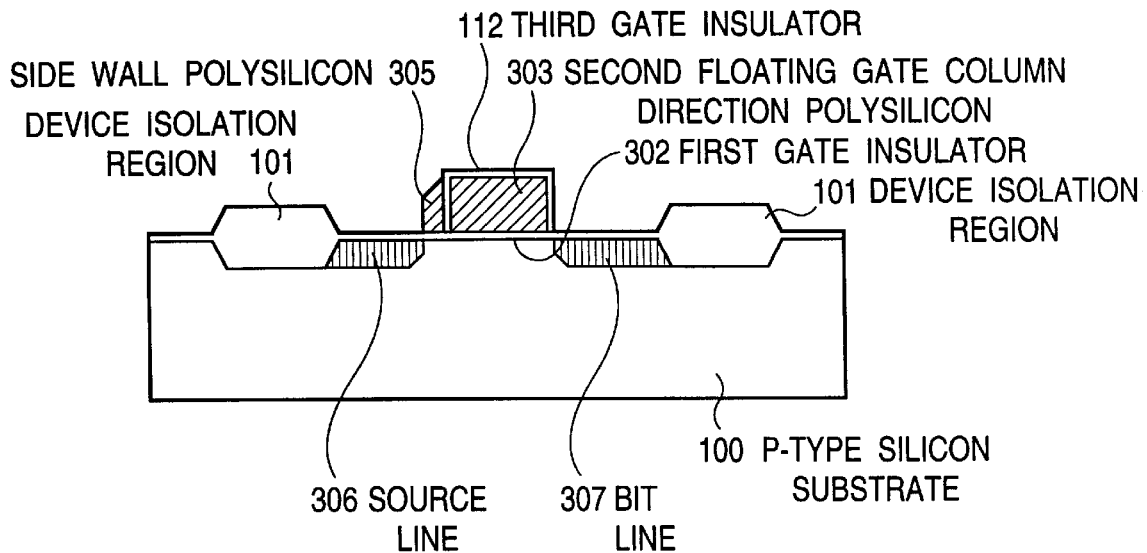

Thereafter, as shown in FIG. 5D, arsenic is ion-implanted with an accelerating energy of 50 keV and a dose of 4E15 $cm^{-2}$, by using as a mask the second floating gate column direction polysilicon 303 and the side wall polysilicon 305, and then, a heat treatment is conducted at a temperature of 900° C. Thus, a pair of N-type buried diffused layers are formed, which are used as a source line 306 and a bit line 307, respectively.

Figure 5E:
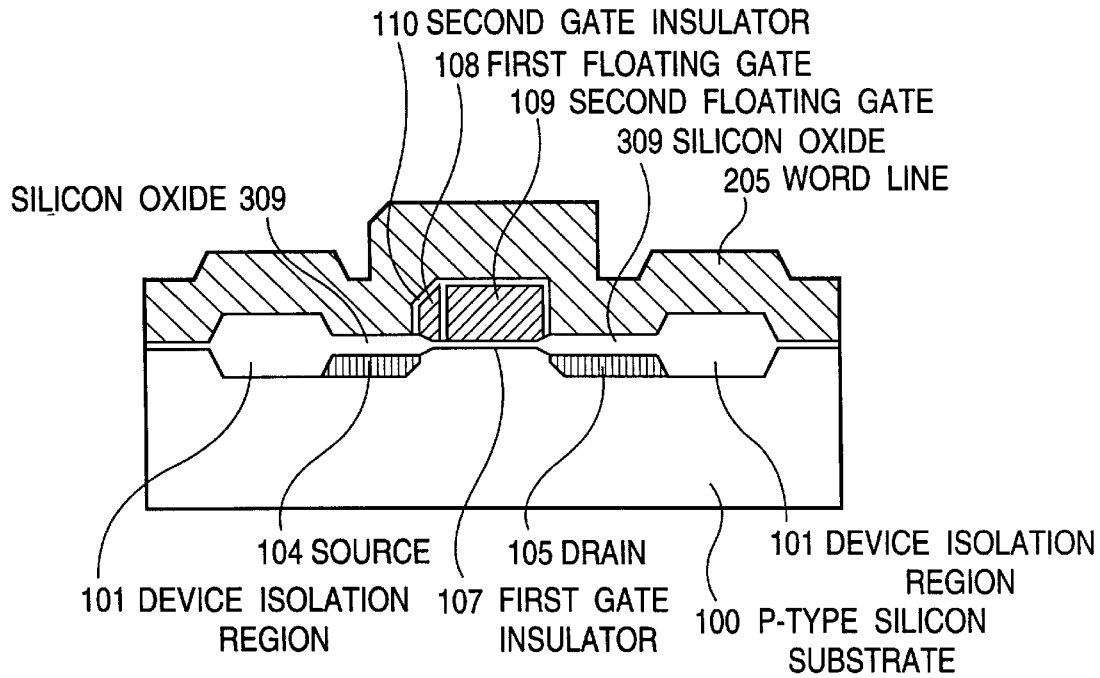

Succeedingly, as shown in FIG. 5E, a silicon oxide film is grown on the surface of the second floating gate column direction polysilicon 303 and the side wall polysilicon 305, by means of a thermal oxidation, so that a second gate insulator film 110 is formed. In the process of the thermal oxidation for forming the second gate insulator film 110, a relatively thick silicon oxide film 309 is formed on the buried diffused layers because of an enhanced oxidation. Thereafter, a third polysilicon is grown on the whole surface, and phosphorus is doped to the third polysilicon.

Then, the third polysilicon is patterned by using a mask corresponding to the word line 205 shown in FIG. 4, and furthermore, the second floating gate column direction polysilicon 303 and the side wall polysilicon 305 are patterned in a self-alignment with the patterned third polysilicon. This patterning is conducted in a row direction (second etching), with the result that a number of memory cells are formed in the form of a matrix. Namely, as shown in FIGS. 5D and 5E, the patterned third polysilicon constitutes the word line 205, the side wall polysilicon 305 constitutes the first floating gate 108, and the second floating gate column direction polysilicon 303 constitutes the second floating gate 109. In addition, a portion of the source line 306 and a portion of the bit line 307, which are positioned under the word line 205 thus patterned, constitute the source region 104 and the drain region 105, respectively. Thus, a cell array of the flash memory is formed. In this construction, the first and second floating gates are arranged in series in a layout pattern between the source region and the drain region.

Incidentally, in the process for patterning the word lines, the relatively thick silicon oxide film 309 acts as an etching stopper for protecting the underlying source line 306 and the underlying bit line 307.

Figure 6:
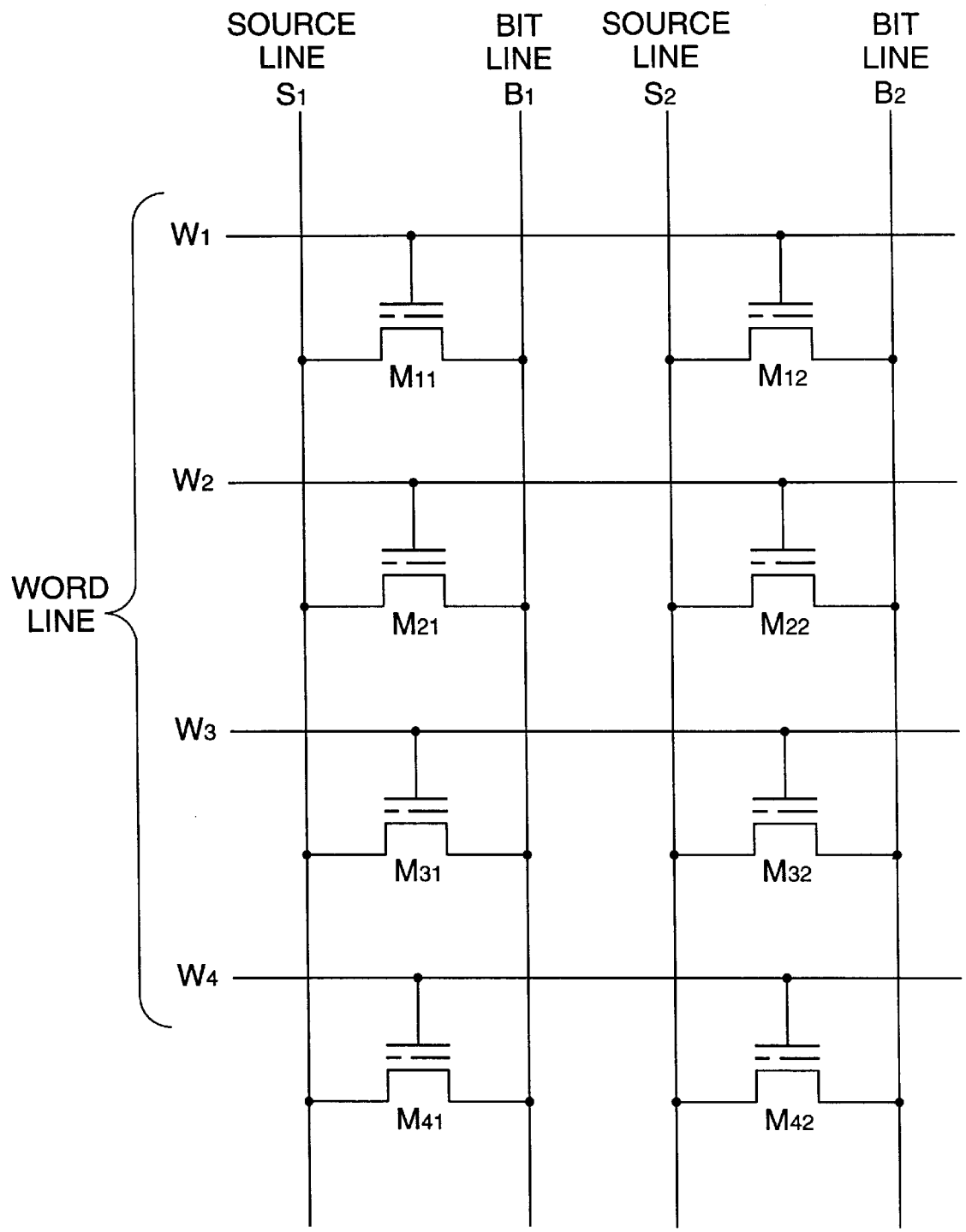
FIG. 6 is an equivalent circuit diagram of the memory cell array shown in FIG. 4.

Next, an operating method of the flash memory of this first embodiment will be described with reference to FIG. 6, which is an equivalent circuit diagram of the memory cell array shown in FIG. 4. In FIG. 6, Reference Signs $W_1$, $W_2$, $W_3$ and $W_4$ designate the word line, and Reference Signs $S_1$ and $S_2$ denotes the source line formed of the buried diffused layer. Reference Signs $B_1$ and $B_2$ indicate the bit line also formed of the buried diffused layer, and Reference Signs $M_{11}$ to $M_{42}$ shows the memory cell. In a two-digit number suffixed to "M", the ten's place number indicates a row number, and the unit's place number indicates a column number.

Here, assume that the condition in which electrons are removed from each of the two floating gates in the memory cell is an erased condition "00", and the condition in which electrons are injected into only the first floating gate is a written condition "01". The condition in which electrons are injected into only the second floating gate is a written condition "10", and the condition in which electrons are injected into both the first and second floating gates is a written condition "11".

First, an operation for writing the erased memory cell will be described. In order to select a memory cell to be written and to inject electrons into the first floating gate of the selected memory cell so as to bring the selected memory cell into the written condition "01", a selected word line is brought to a positive voltage, for example, +12 V, and a selected source line is brought to a positive voltage, for example, +5 V. The other lines, namely, non-selected word lines, non-selected source lines and all the bit lines are grounded. Thus, electrons are injected from the drain to the source in the selected memory cell, and hot electrons are generated in a high electric field region at a drain side end of the first floating gate, so that the generated hot electrons are injected into the first floating gate.

On the other hand, in order to select a memory cell to be written and to inject electrons into the second floating gate of the selected memory cell so as to bring the selected memory cell into the written condition "10", a selected word line is brought to a positive voltage, for example, +12 V, and a selected bit line is brought to a positive voltage, for example, +5 V. The other lines, namely, non-selected word lines, non-selected bit lines and all the source lines are grounded. Thus, electrons are injected from the source to the drain in the selected memory cell, and hot electrons generated at a source side end of the second floating gate are injected into the second floating gate.

In order to select a memory cell to be written and to inject electrons into the first and second floating gates of the selected memory cell so as to bring the selected memory cell into the written condition "11", the above mentioned operation for writing "01" into the selected memory cell and the above mentioned operation for writing "10" into the selected memory cell, are conducted continuously. Accordingly, after the electrons are injected into the first floating gate, the electrons are injected into the second floating gate. Thus, the written condition "11" is obtained.

The above mentioned writing operation is conducted by applying a first positive voltage (for example, +12 V) and a second positive voltage (for example, +5 V) to the control gate of the memory cell and one of the source and the drain (a pair of diffused regions), respectively, and by grounding the other of the source and the drain, so that channel hot electrons are generated in the proximity of the grounded diffused region and are injected into a floating gate near to the positive-voltage-applied diffused region with a high efficiency (source-side injection). For example, in a memory cell having a gate length (distance between the source and the drain) on the order of 0.8 µm, the writing operation of the writing time of 5 µs can be realized with a channel current of 50 µA.

Next, an erasing operation will be described. The erasing operation is conducted by erasing all the memory cells belonging to the same word line in bundle. For this purpose, a negative voltage (for example, −16 V) is applied to a selected word line, and all non-selected word lines, all the source lines and the bit lines and the silicon substrate are grounded. Thus, electrons are extracted or discharged from the floating gate into the silicon substrate by action of a Fowler-Nordheim tunnel current.

Finally, a reading operation of the memory cell can be conducted by sensing the value of a current flowing through a selected bit line when a positive voltage (for example, +3 V) and another positive voltage (for example, +1 V) are applied to a selected word line and the selected bit line, respectively, and on the other hand, all non-selected word lines, non-selected bit lines and the source lines are grounded. In this reading operation, the magnitude of the reading current becomes small in the order of the written conditions "00">"01">"10">"11".

As is apparent to persons skilled in the art, the field effect transistor has such a nature that even if the source and the drain can be exchanged each other, the same function can be realized. Accordingly, even if the region 104 is deemed as a drain and the region 105 is deemed as a source, a memory cell can be realized similarly. In this case, however, a drain-side floating gate has a width smaller than that of a source-side floating gate.

The above mentioned operation of the memory cell can be summarized in the following TABLE 1:

TABLE 1

|  | selected word line | non-selected word line | selected bit line | non-selected bit line | selected source line | non-selected source line |
|---|---|---|---|---|---|---|
| reading | +3 | 0 | +1 | 0 | 0 | 0 |
| writing of "01" | +12 | 0 | 0 | 0 | +5 | 0 |
| writing of "10" | +12 | 0 | +5 | 0 | 0 | 0 |
| erase | −16 | 0 | 0 | 0 | 0 | 0 |

Figure 7A:
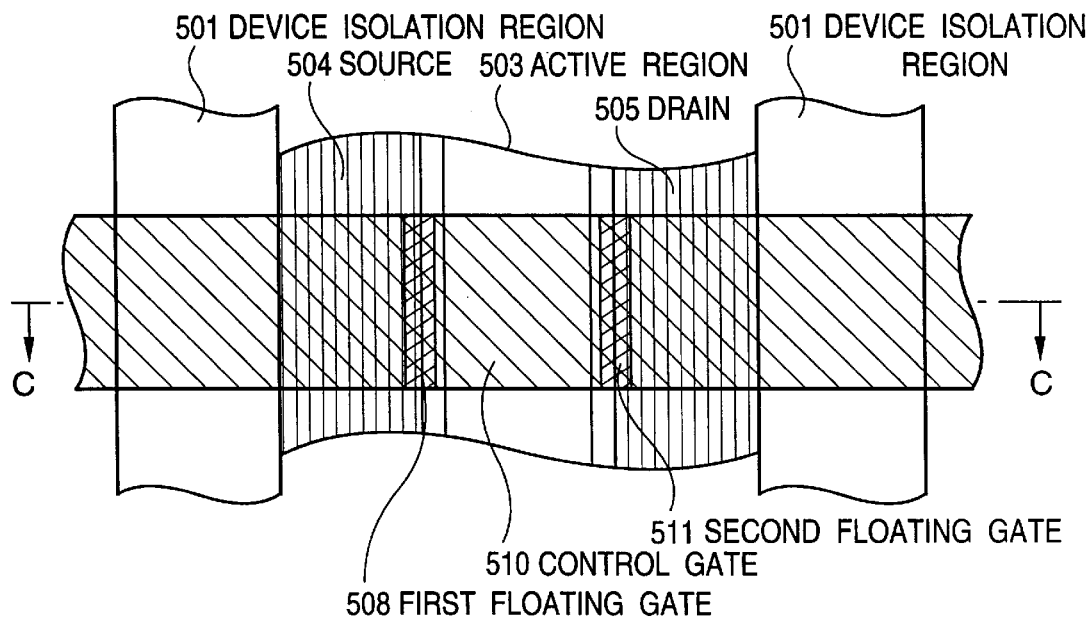
FIG. 7A is a diagrammatic partial plan view of a multi-bit memory cell of a second embodiment of the nonvolatile semiconductor memory in accordance with the present invention.
Figure 7B:
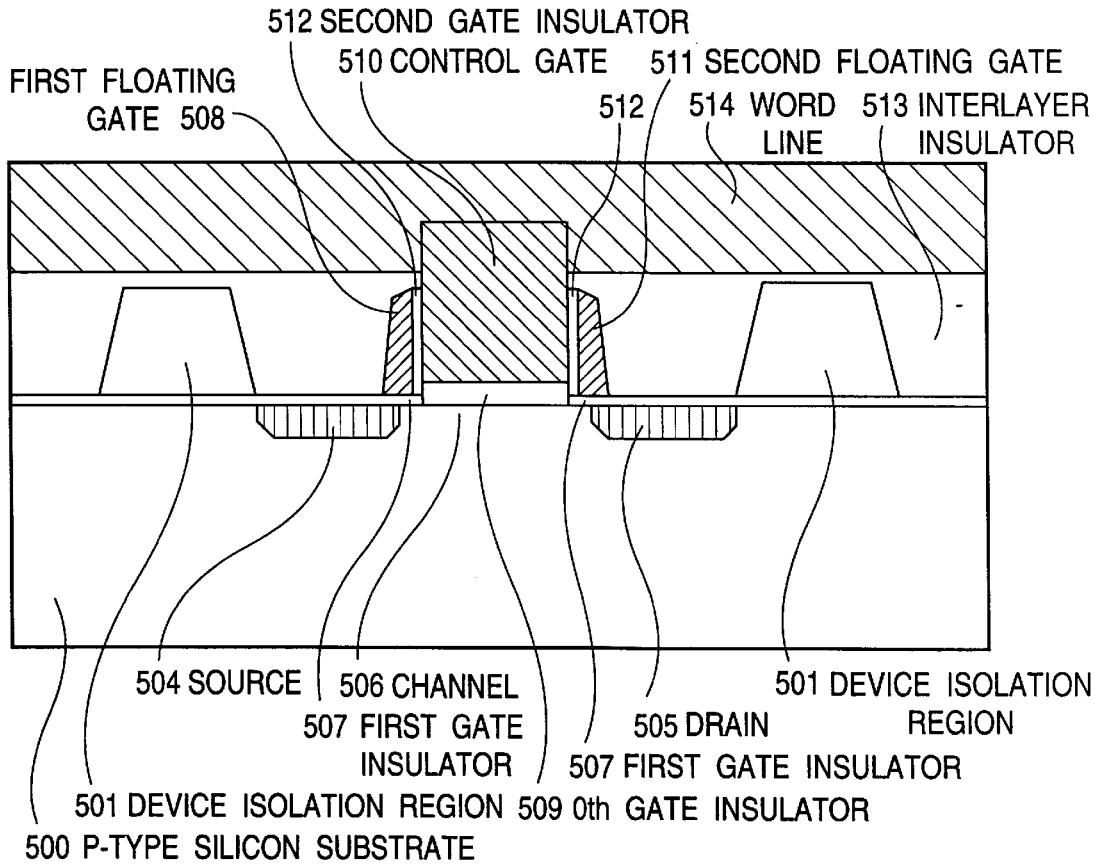
FIG. 7B is a diagrammatic sectional view taken along the line C—C in FIG. 7A.

Referring to FIG. 7A, there is shown a diagrammatic partial plan view of a multi-bit memory cell of a second embodiment of the nonvolatile semiconductor memory in accordance with the present invention. FIG. 7B is a diagrammatic sectional view taken along the line C—C in FIG. 7A.

The second embodiment is a flash memory, similarly to the first embodiment. A unitary flash memory cell shown in FIGS. 7A and 7B is formed in an active region 503 formed on a P-type silicon substrate 500 and confined between device isolation regions 501 formed of a silicon oxide on a principal surface of the substrate 500. The shown unitary flash memory cell includes a source region 504 and a drain region 505 formed in the active region 503, separately from each other, to define a channel region 506 therebetween. On a center region of the channel region 506, a 0th gate insulator film 509 is formed, and a control gate 510 is formed on the 0th gate insulator film 509. On a remaining region of the channel region 506, namely on opposite end regions of the channel region 506, a first gate insulator film 507 is formed, and a first floating gate 508 and a second floating gate 509 are formed on the first gate insulator film 507, at opposite sides of the control gate 510. Each of the first floating gate 508 and the second floating gate 509 is electrically isolated from the control gate 510 by a second gate insulator film 512 which is formed on each side surface of the control gate 510. Furthermore, an interlayer insulator 513 is formed to completely cover the surface of the substrate 500, the device isolation region 501, and the first and second floating gates 508 and 511, but to allow the control gate 510 to project from the interlayer insulator 513. A word line 514 formed of a polycide is provided on the interlayer insulator 513 to be interconnected with the control gate 510.

Figure 8:
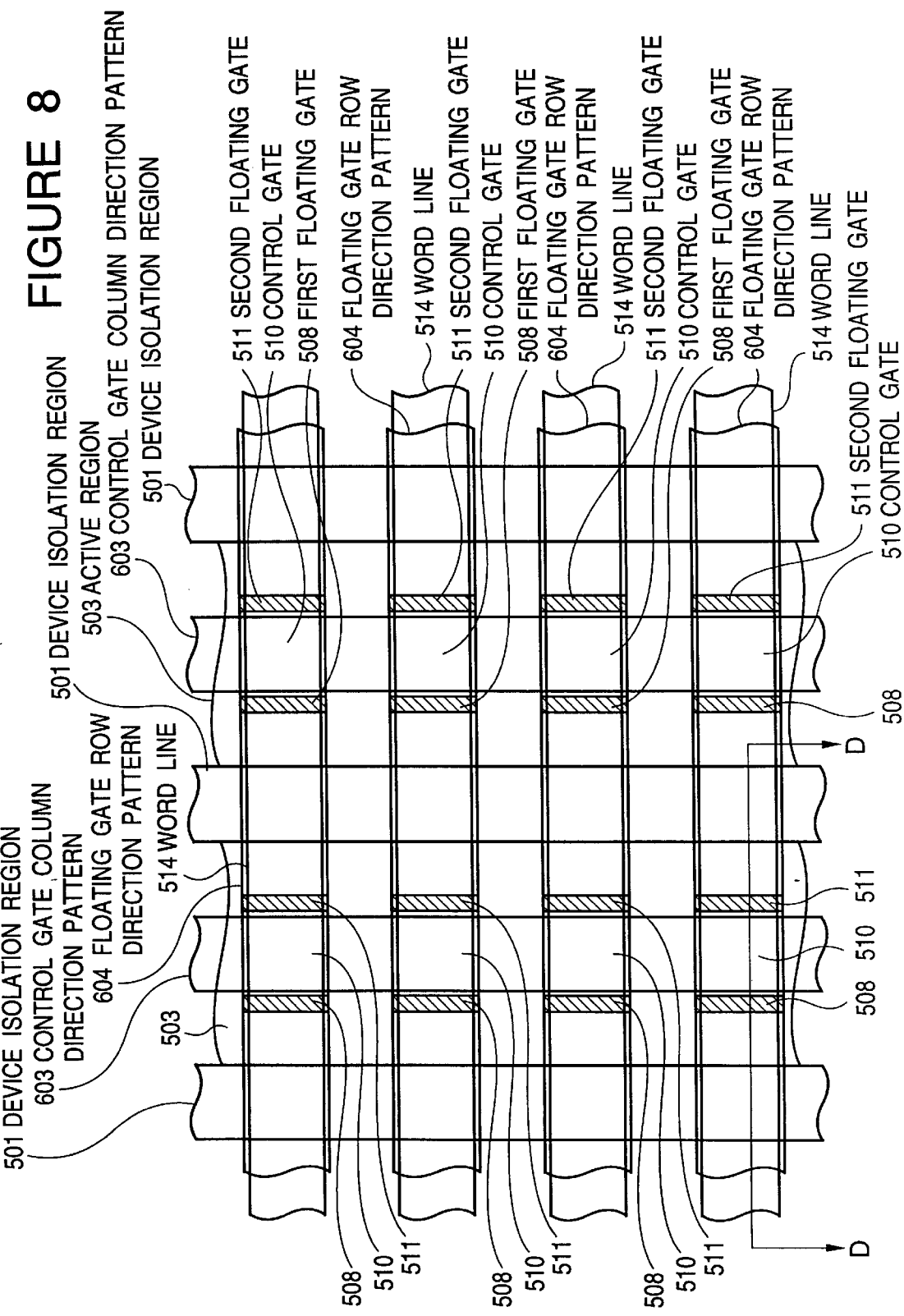
FIG. 8 is a mask layout pattern diagram of a memory cell array composed of memory cells shown in FIGS. 7A and 7B.

Now, referring to FIG. 8, there is shown a mask layout pattern diagram of a memory cell array composed of memory cells shown in FIGS. 7A and 7B. The shown memory cell array has a contactless structure in which each of a bit line and a source line is constituted of a buried diffused layer. In addition, FIG. 8 mainly depicts mask layout patterns used in a photolithographic process, but the floating gates are depicted by hatching to assist understanding.

In FIG. 8, Reference Numeral 501 designates a device isolation region, and Reference Numeral 503 indicates an active region which is a region other than the device isolation regions 501. Reference Numeral 603 shows a control gate column direction pattern, and Reference Numeral 604 denotes a floating gate row direction pattern. Reference Numeral 514 designates the word line constituting a mask pattern, and Reference Numeral 508 designates a first floating gate. Reference Numeral 510 shows a control gate, and Reference Numeral 511 indicates a second floating gate.

FIGS. 9A to 9F are diagrammatic sectional views taken along the line D—D in FIG. 8, for illustrating a process for manufacturing the memory cell shown in FIGS. 7A and 7B.

Now, a process for manufacturing the flash memory cell shown in FIGS. 7A and 7B, will be described with reference to FIGS. 8 and 9A to 9F.

Figure 9A:
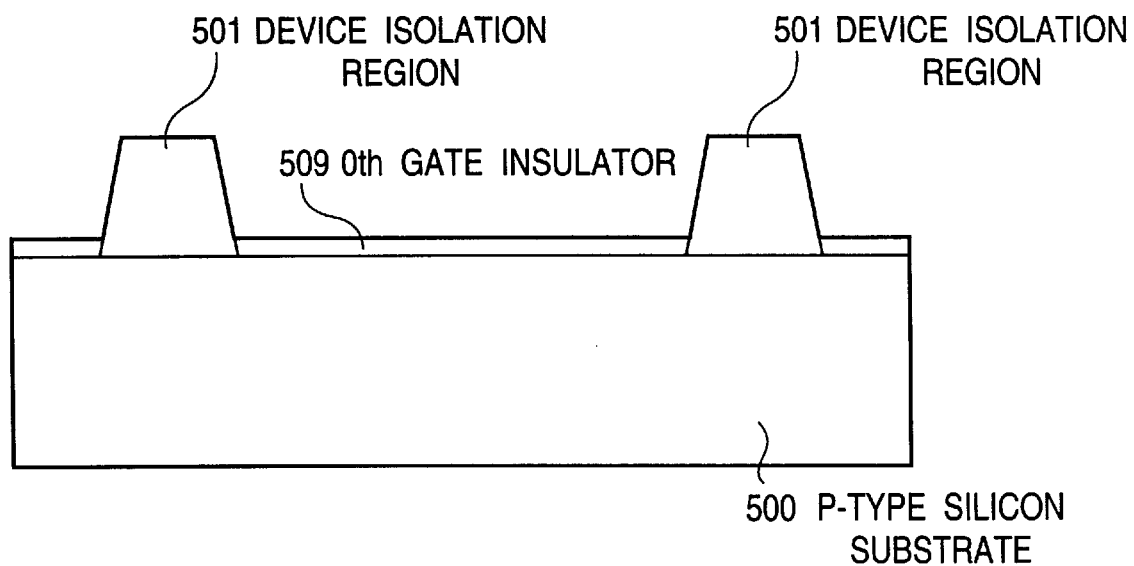
FIGS. 9A to 9F are diagrammatic sectional views along the line D—D in FIG. 8, illustrating a process for manufacturing the memory cell shown in FIGS. 7A and 7B.

First, a silicon oxide film having a thickness of about 300 nm is formed on a principal surface of a P-type silicon substrate 500, and patterned by mean of a photolithography using a mask corresponding to a pattern of the device isolation regions 501 shown in FIG. 8, and a dry etching, so that the device isolation regions 501 tapered as shown in FIG. 9A is formed. Then, a silicon oxy-nitride film having a thickness of about 25 nm is formed to form a 0th gate insulator film 509.

Figure 9B:
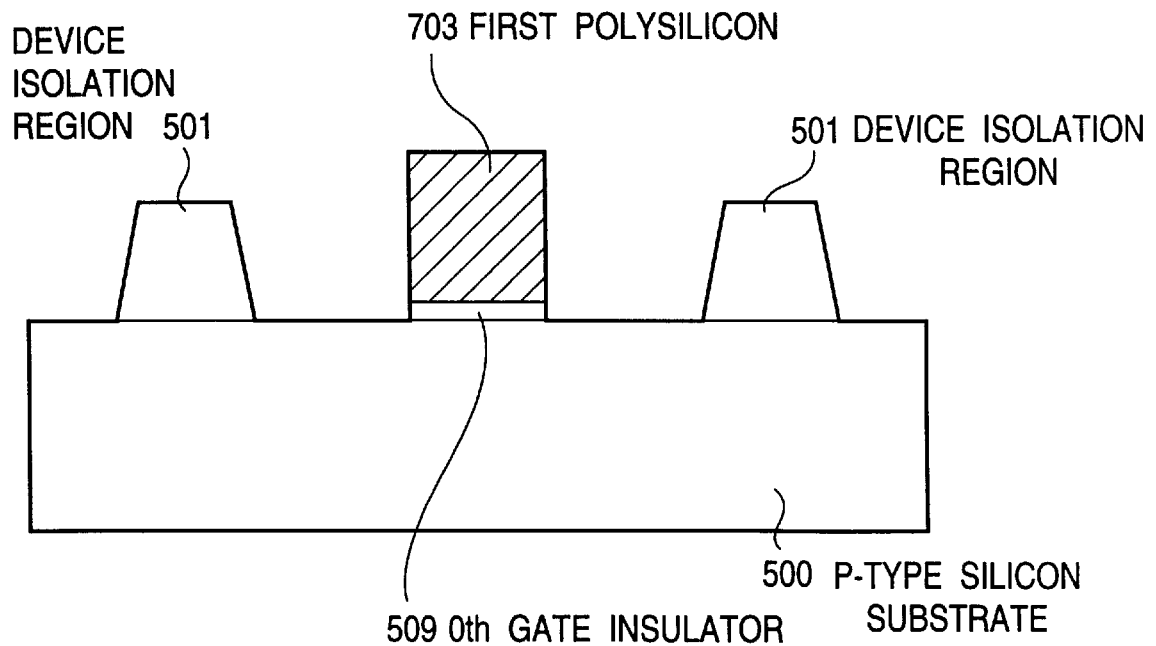

Thereafter, a phosphorus-doped, first polysilicon film having a thickness of about 350 nm is grown on the whole surface. Furthermore, the first polysilicon and the 0th gate insulator film 509 are patterned in a column direction by mean of a photolithography using a mask corresponding to the control gate column direction pattern 603 shown in FIG. 8, and a dry etching (first etching). A patterned polysilicon 703 and the patterned 0th gate insulator film 509 corresponding to the control gate column direction pattern 603 are formed as shown in FIG. 9B.

Succeedingly, a first gate insulator film 507 having a thickness of about 10 nm converted in an oxide film thickness is formed on the principal surface of the substrate 500, and a second gate insulator film 512 having a thickness of about 20 nm converted in an oxide film thickness is formed on a surface of the patterned polysilicon 703.

As one method for forming the above two films, it is exemplified to positively utilizes a difference in oxidation rate between the silicon substrate and the polysilicon. In this method, an oxide film having a thickness of about 10 nm (which becomes the first gate insulator film 507) is grown by a thermal oxidation on the principal surface of the substrate 500, and simultaneously, an oxide film having a thickness of about 20 nm (which becomes the second gate insulator film 512) is grown by a thermal oxidation on the surface of the patterned polysilicon 703.

According to another method, a composite film composed of silicon oxide film—silicon nitride film—silicon oxide film (ONO film) having having a thickness of about 20 nm converted in an oxide film thickness is formed on the principal surface of the substrate 500 and on the surface of the patterned polysilicon 703, and then, an anisotropic dry etching is conducted to cause the ONO film to be left only on each side wall of the patterned polysilicon 703. Succeedingly, the surface of the silicon substrate 500 is thermally oxidized to form an oxide film having a thickness of about 20 nm on the surface of the patterned polysilicon 703 and a thickness of about 10 nm on the surface of the silicon substrate 500.

Figure 9C:
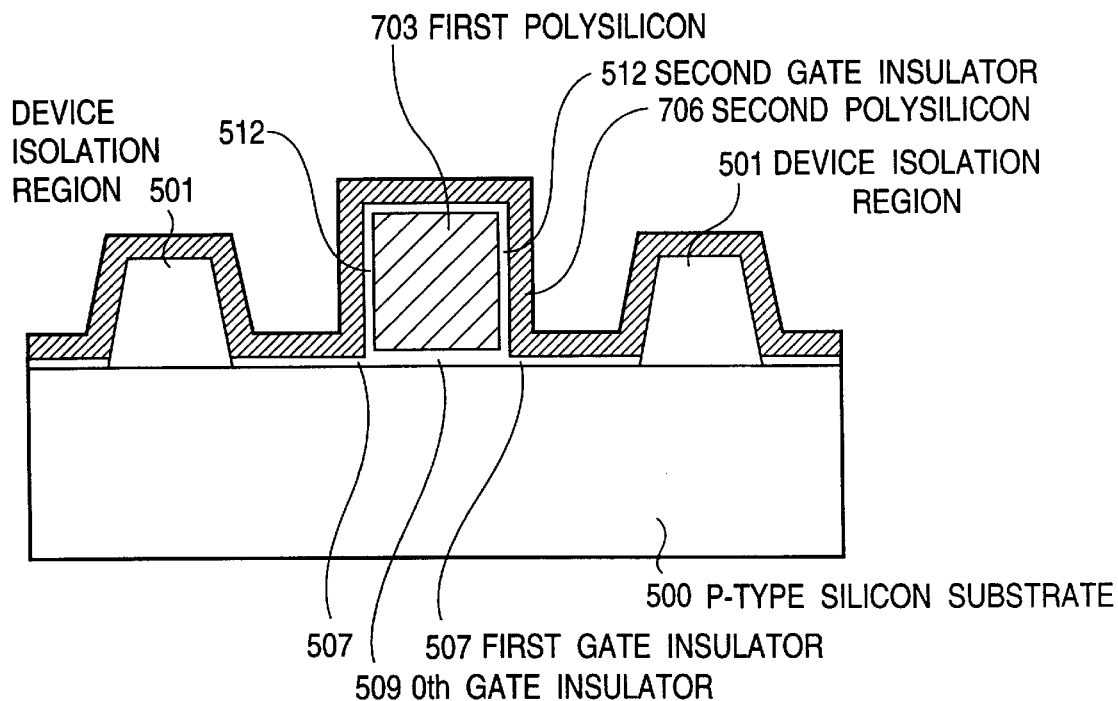

After the first gate insulator film 507 and the second gate insulator film 512 are formed, a second polysilicon film 706 having a thickness of about 5 nm to 30 nm is grown on the whole surface as shown in FIG. 9C, and phosphorus is doped into the second polysilicon film 706.

Figure 9D:
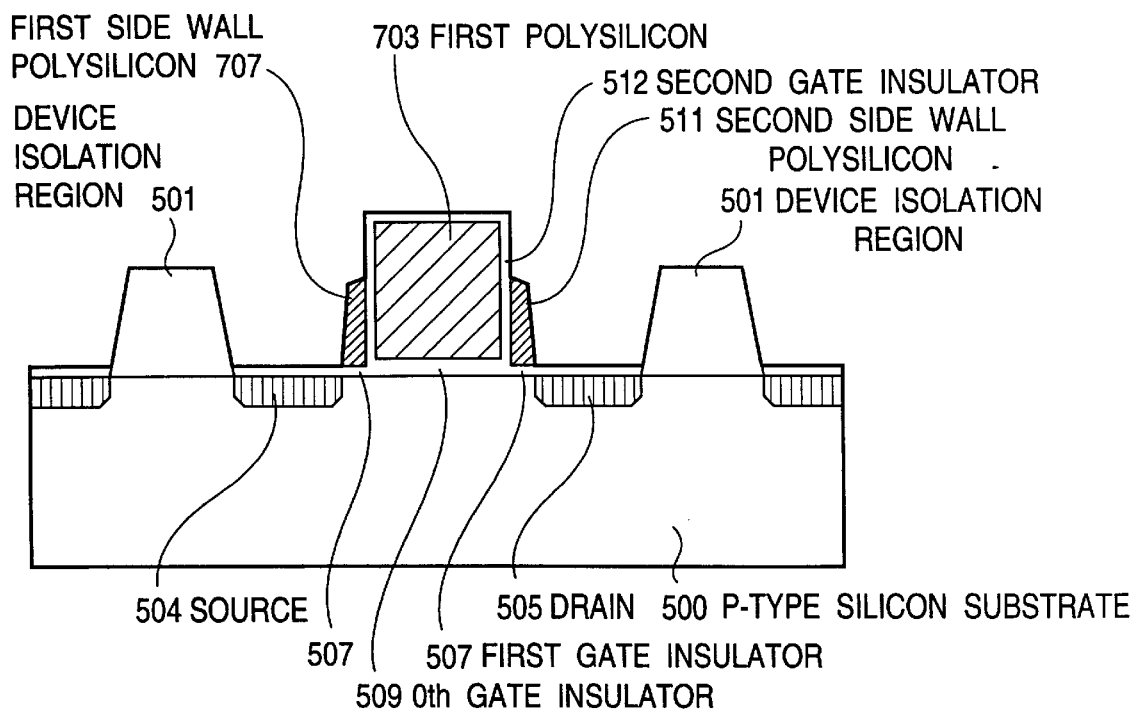

Then, an anisotropic etching is conducted to the second polysilicon film 706, to cause the second polysilicon film 706 to be left only on each side wall of the pattern first polysilicon 703 corresponding to the control gate column direction pattern 603. Thus, a first side wall polysilicon 707 and a second side wall polysilicon 708 are formed as shown in FIG. 9D. Here, a width (in a gate length direction) of each of the side wall polysilicons 707 and 708 ordinarily becomes on the order of 70% to 100% of the film thickness of the second polysilicon, but can be precisely controlled.

Thereafter, as shown in FIG. 9D, arsenic is ion-implanted with an accelerating energy of 50 keV and a dose of 1E15 $cm^{-2}$ to 5E15 $cm^{-2}$, by using as a mask the patterned first polysilicon 703 and the side wall polysilicons 707 and 708, and then, a heat treatment is conducted at a temperature of 900° C. Thus, a pair of N-type buried diffused layers are formed as a source (source line) 504 and a drain (bit line) 505, respectively.

Succeedingly, the patterned first polysilicon 703 and the side wall polysilicons 707 and 708 are simultaneously patterned by mean of a photolithography using a mask corresponding to the floating gate row direction pattern 604 and a succeeding dry etching (second etching).

Figure 9E:
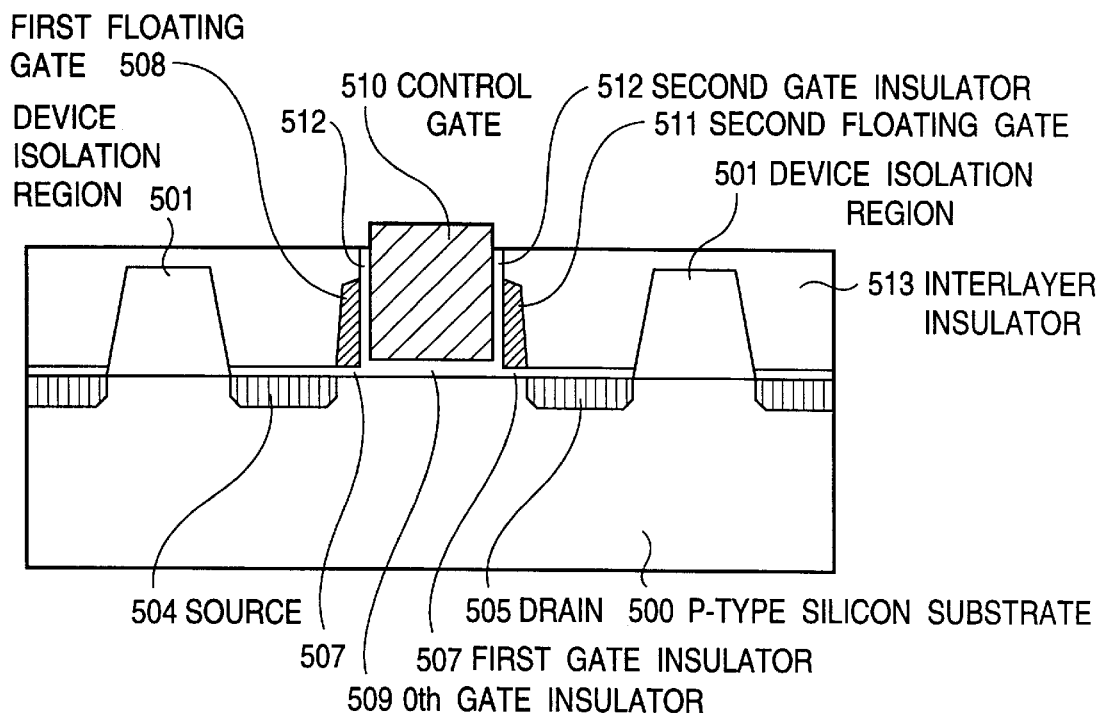

In the above patterning process, the first side wall polysilicon 707 and the second side wall polysilicon 708 are patterned to form the first floating gate 508 and the second floating gate 511, respectively, which are electrically insulated from each other as shown in FIG. 9E, and also, the first polysilicon 703 is patterned to form the control gate 510.

A borophosphosilicate glass (BPSG) film having a thickness of 500 nm is deposited and a re-flow is conducted to form an interlayer insulator film 513, which is thereafter etched back so that the control gate 510 is exposed, as shown in FIG. 9E.

Figure 9F:
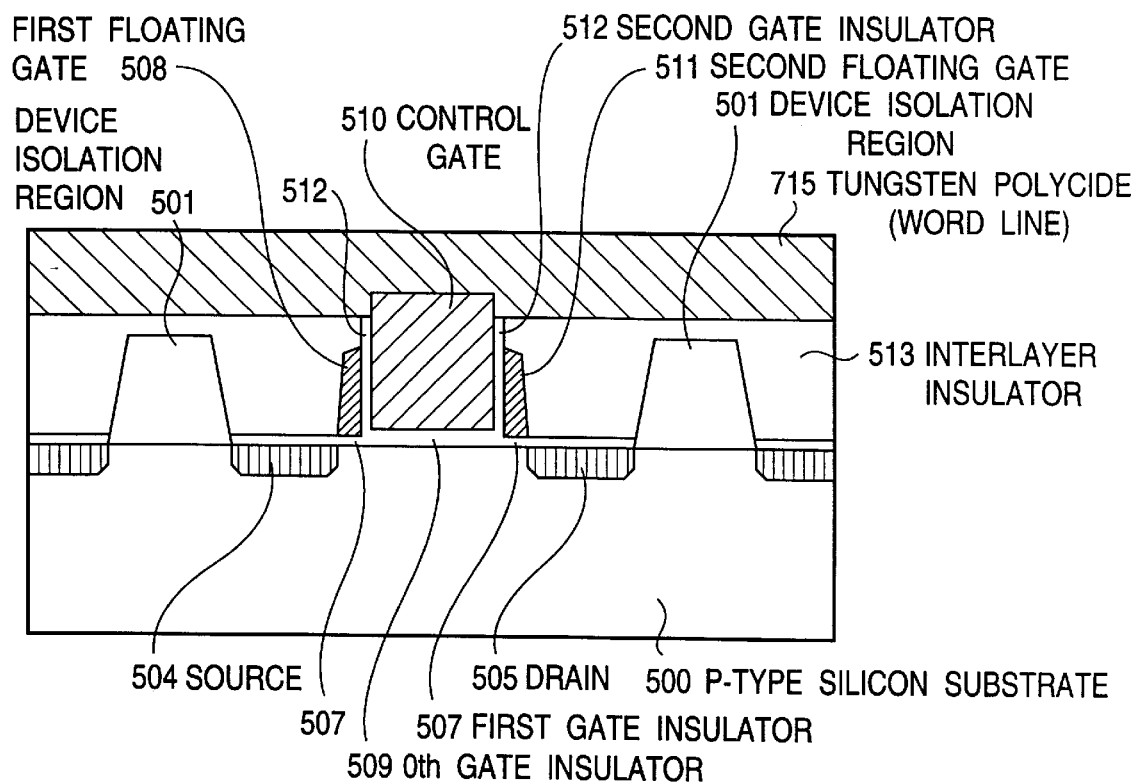

Finally, as shown in FIG. 9F, a tungsten polycide 715 is deposited by sputtering, and then, the tungsten polycide 715 is patterned by means of a photolithography using a mask corresponding to the word line 514 shown in FIG. 8, and a dry etching, so that the word line 514 shown in FIG. 8 is formed.

Thus, a memory cell array of the flash memory is formed. A gate length of the memory cell thus formed is equal to a sum of a gate length of the control gate, a gate length of the first floating gate and a gate length of the second floating gate. However, as mentioned above, the gate length of each floating gate is on the order of 70% to 100% of the grown film thickness of the polysilicon formed to constitute the floating gate. Therefore, by making the grown film thickness of the polysilicon sufficiently small, it is possible to avoid an increase of a memory cell occupying area.

Next, an operating method of the flash memory of this second embodiment will be described with reference to FIG. 10, which is an equivalent circuit diagram of the memory cell array shown in FIG. 8.

Figure 10:
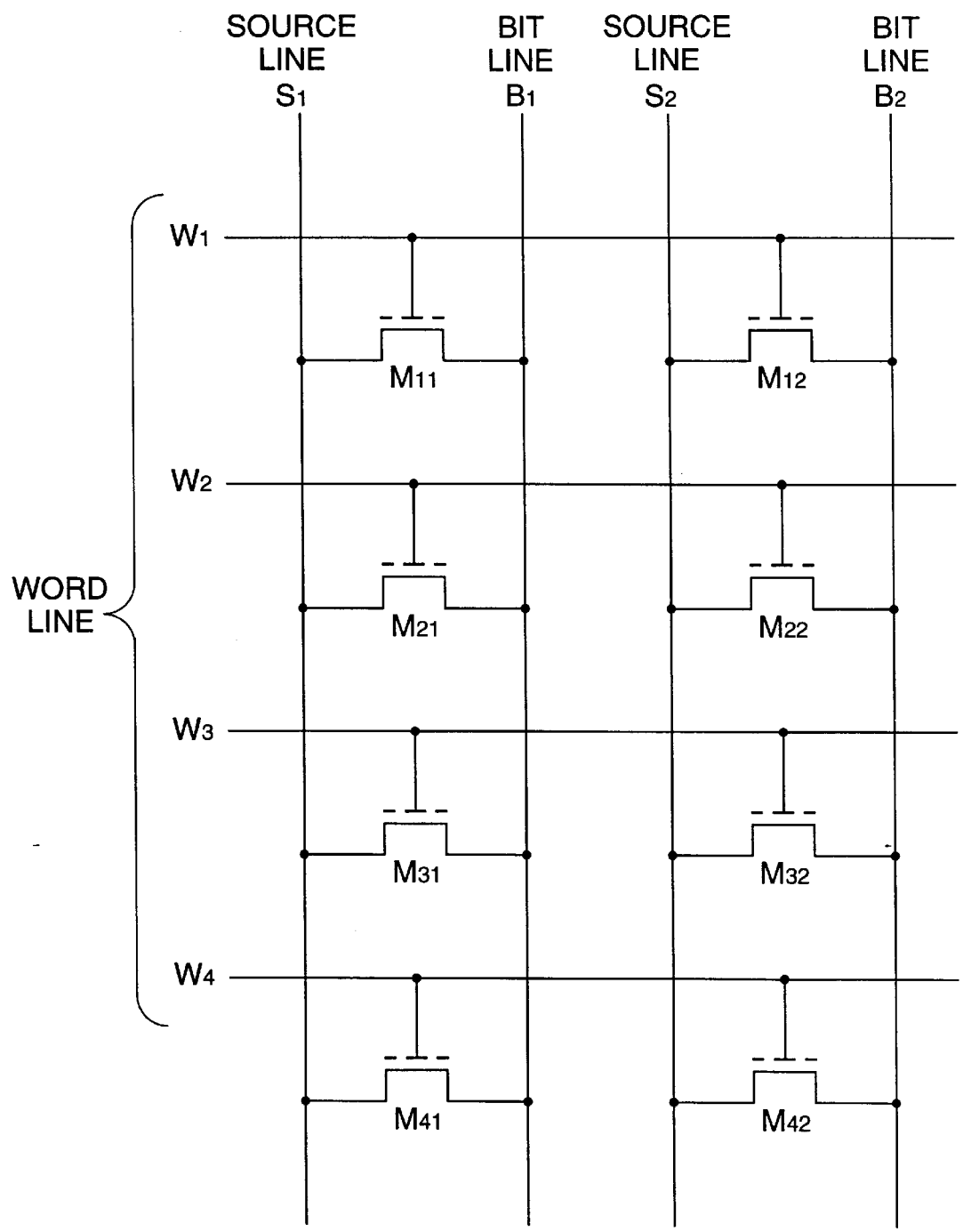
FIG. 10 is an equivalent circuit diagram of the memory cell array shown in FIG. 8

In FIG. 10, similarly to FIG. 6, Reference Signs $W_1$, $W_2$, $W_3$ and $W_4$ designate the word line, and Reference Signs $S_1$ and $S_2$ denotes the source line formed of the buried diffused layer. Reference Signs $B_1$ and $B_2$ indicate the bit line also formed of the buried diffused layer, and Reference Signs $M_{11}$ to $M_{42}$ shows the memory cell. In a two-digit number suffixed to "M", the ten's place number indicates a row number, and the unit's place number indicates a column number.

Here, assume that the condition in which electrons are injected into both the first and second floating gates is an erased condition "00", and the condition in which electrons are removed from only the first floating gate is a written condition "01". The condition in which electrons are removed from only the second floating gate is a written condition "10", and the condition in which electrons are removed from each of the two floating gates in the memory cell is a written condition "11".

First, an operation for writing the erased memory cell will be described. In order to select a memory cell and to remove electrons from the first floating gate of the selected memory cell so as to bring the selected memory cell into the written condition "01", a selected word line is brought to a negative voltage, for example, −14 V, and a selected source line is brought to a positive voltage, for example, +5 V. The other lines, namely, non-selected word lines, non-selected source lines and all the bit lines are grounded. Thus, a high voltage is applied only between the first floating gate and the source of the selected memory cell, so that electrons are discharged from the first floating gate to the source by action of the Fowler-Nordheim tunnel current. At this time, a voltage difference between the second floating gate and the drain and a voltage difference between the second floating gate and the substrate are not sufficient to cause the Fowler-Nordheim tunnel current, so that electrons are not discharged from the second floating gate.

On the other hand, in order to select a memory cell and to remove electrons from the second floating gate of the selected memory cell so as to bring the selected memory cell into the written condition "10", a selected word line is brought to a negative voltage, for example, −14 V, and a selected bit line is brought to a positive voltage, for example, +5 V. The other lines, namely, non-selected word lines, non-selected bit lines and all the source lines are grounded. Thus, a high voltage is applied only between the second floating gate and the drain of the selected memory cell, so that electrons are discharged from the second floating gate to the drain by action of the Fowler-Nordheim tunnel current. At this time, a voltage difference between the first floating gate and the source and a voltage difference between the first floating gate and the substrate are not sufficient to cause the Fowler-Nordheim tunnel current, so that electrons are not discharged from the first floating gate.

In order to select a memory cell to be written and to remove electrons from both the first and second floating gates of the selected memory cell so as to bring the selected memory cell into the written condition "11", the above mentioned operation for writing "01" into the selected memory cell and the above mentioned operation for writing "10" into the selected memory cell, are conducted continuously. Accordingly, after the electrons are discharged from the first floating gate, the electrons are discharged from the second floating gate. Thus, the written condition "11" is obtained.

The above mentioned writing operation will be described with reference to a numerical example. Assuming that a capacitive coupling ratio of the floating gate is 0.5, and −12 V is applied to the control gate, a potential of −6 V (=−12 V×0.5) is induced on the floating gate. If +5 V is applied to the selected source line, a voltage difference between the first floating gate and the source becomes 11 V {+5 V −(−6 V)}. An electric field of 11 MV/cm acts on the oxide film having the film thickness of 10 nm existing between the first floating gate and the source, with the result that the Fowler-Nordheim tunnel current flows. On the other hand, a voltage difference between the first floating gate and the drain and a voltage difference between the first floating gate and the substrate are 6 V, and a voltage difference between the second floating gate and the drain and a voltage difference between the second floating gate and the substrate are also 6 V, so that no Fowler-Nordheim tunnel current flows. In addition, in non-selected memory cells connected to the selected word line, a voltage difference between each floating gate and the source, the drain or the substrate is 6 V, and in non-selected memory cells connected to the selected source or bit line, a voltage difference between each floating gate and the source, the drain or the substrate is 5 V, with the result that no Fowler-Nordheim tunnel current flows.

Next, an easing operation for bringing the memory cell into the erased condition. The erasing operation is conducted by erasing all the memory cells belonging to the same word line in bundle. For this purpose, a positive voltage (for example, +16 V) is applied to a selected word line, and all non-selected word lines, all the source lines and the bit lines and the silicon substrate are grounded. Thus, electrons are injected into the floating gate from the silicon substrate by action of the Fowler-Nordheim tunnel current.

Finally, a reading operation of the memory cell can be conducted by sensing the value of a current flowing through a selected bit line when a positive voltage (for example, +3 V) and another positive voltage (for example, +1 V) are applied to a selected word line and the selected bit line, respectively, and on the other hand, all non-selected word lines, the non-selected bit lines and the source lines are grounded. In this reading operation, the magnitude of the reading current becomes large in the order of the written conditions "00"<"01"<"10"<"11".

The above mentioned operation of the memory cell can be summarized in the following TABLE 2:

TABLE 2

|  | selected word line | non-selected word line | selected bit line | non-selected bit line | selected source line | non-selected source line |
|---|---|---|---|---|---|---|
| reading | +3 | 0 | +1 | 0 | 0 | 0 |
| writing of "01" | −14 | 0 | 0 | 0 | +5 | 0 |
| writing of "10" | −14 | 0 | +5 | 0 | 0 | 0 |
| erase | +16 | 0 | 0 | 0 | 0 | 0 |

As seen from the above description of the embodiments, the nonvolatile semiconductor memory in accordance with the present invention is advantageous in that the occupying area of each memory cell can be greatly reduced, because at least one of two floating gates is composed of a side wall of the polysilicon, and therefore, the gate length of the at least one floating gate can be smaller than the patterning limit of the photolithography (design standard).

Furthermore, the nonvolatile semiconductor memory in accordance with the present invention is advantageous in that since the memory cells can be operated with a low power supply voltage, a peripheral circuit can be realized in a reduced occupying area. The reason for this is that, since the memory cell writing operation can be carried out by either the source-side channel hot electron injection or the Fowler-Nordheim tunnel current, the consumed current of the writing operation becomes remarkably small, and therefore, a necessary capacity or power of a step-up or boosting circuit can be reduced, which results in a reduced occupying area of the step-up or boosting circuit. Furthermore, it is possible to obtain a necessary writing/erasing voltage from a low power supply voltage.

The invention has thus been shown and described with reference to the specific embodiments. However, it should be noted that the present invention is in no way limited to the details of the illustrated structures but changes and modifications may be made within the scope of the appended claims.

I claim:

1. A nonvolatile semiconductor memory composed of a number of memory cells, each of which is constituted of a transistor comprising:

a semiconductor substrate having a principal surface of a first conductivity type;

a source region and a drain region formed in said principal surface of said semiconductor substrate, said source region and said drain region being of a second conductivity type opposite to said first conductivity type;

a channel region defined in said principal surface of said semiconductor substrate between said source region and said drain region;

a first gate insulator film formed on said channel region;

a first floating gate formed on said first gate insulator film above a source side portion of said channel region;

a second floating gate formed on said first gate insulator film above a drain side portion of said channel region, said second floating gate being electrically insulated from said first floating gate;

a second gate insulator film formed on a surface of each of said first floating gate and said second floating gate;

a control gate formed on said second gate insulator film and above both said first and second floating gates with said second gate insulator film being interposed between said control gate and each of said first floating gate and said second floating gate;

wherein said first floating gate and said second floating gate are arranged in series in a layout pattern between said source region and said drain region[, and said first floating gate and said second floating gate can be programmed to store a charge independently from one another]; and a gate length of said first floating gate is shorter than a gate length of said second floating gate or a gate length of said control gate.

2. A nonvolatile semiconductor memory claimed in claim 1 wherein said principal surface of said semiconductor substrate is of a P type.

3. A nonvolatile semiconductor memory claimed in claim 1 wherein said first floating gate is formed of a side wall polysilicon.

4. A nonvolatile semiconductor memory claimed in claim 1 wherein a third gate insulator film is formed on a source-side side wall of said second floating gate, and said first floating gate is constituted of a side wall polysilicon formed on said third gate insulator film formed on said source-side side wall of said second floating gate to have the gate length shorter than that of said second floating gate.

5. A nonvolatile semiconductor memory composed of a number of memory cells, each of which is constituted of a transistor comprising:

a semiconductor substrate having a principal surface of a first conductivity type;

a source region and a drain region formed in said principal surface of said semiconductor substrate, said source region and said drain region being of a second conductivity type opposite to said first conductivity type;

a channel region defined in said principal surface of said semiconductor substrate between said source region and said drain region;

a first gate insulator film formed on said channel region;

a first floating gate formed on said first gate insulator film above a source side portion of said channel region;

a second floating gate formed on said first gate insulator film above a drain side portion of said channel region, said second floating gate being electrically insulated from said first floating gate;

a second gate insulator film formed on a surface of each of said first floating gate and said second floating gate; and a control gate formed on said second gate insulator film with said second gate insulator film being sandwiched between said control gate and each of said first floating gate and said second floating gate; and further, wherein said control gate is formed on a gate insulator film formed on a center portion of said channel region, and said second gate insulator is formed on each of a pair of opposite side walls of said control gate, and said first floating gate is formed of a side wall polysilicon formed on said second gate insulator formed a source-side side wall of said opposite side walls of said control gate, and said second floating gate is formed of a side wall polysilicon formed on said second gate insulator formed a drain-side side wall of said opposite side walls of said control gate, so that the gate length of each of said first floating gate and said second floating gate is shorter than the gate length of said control gate, said first floating gate and said second floating gate being arranged in series in a layout pattern between said source region and said drain region, a gate length of said first floating gate being shorter than a gate length of said second floating gate or a gate length of said control gate.

* * * * *

UNITED STATES PATENT AND TRADEMARK OFFICE
CERTIFICATE OF CORRECTION

PATENT NO. : 5,929,480
DATED : July 27, 1999
INVENTOR(S) : Yosiaki HISAMUNE

It is certified that error appears in the above-identified patent and that said Letters Patent is hereby corrected as shown below:

Column 16, lines 3-6, delete "[, and said first floating gate and said second floating gate can be programmed to store a charge independently from one another]".

Signed and Sealed this

Ninth Day of May, 2000

Attest:

Q. TODD DICKINSON

Attesting Officer

Director of Patents and Trademarks